(12) United States Patent
Murray, Jr. et al.

(10) Patent No.: US 9,260,071 B2
(45) Date of Patent: Feb. 16, 2016

(54) APPARATUS FOR SNAP MOUNTING A CRASH SENSOR

(71) Applicant: TRW Automotive U.S. LLC, Livonia, MI (US)

(72) Inventors: Neil Gordon Murray, Jr., Wixom, MI (US); Mark Ramsay, Livonia, MI (US)

(73) Assignee: TRW Automotive U.S. LLC, Livonia, MI (US)

(*) Notice: Subject to any disclaimer, the term of this patent is extended or adjusted under 35 U.S.C. 154(b) by 0 days.

(21) Appl. No.: 14/203,999

(22) Filed: Mar. 11, 2014

(65) Prior Publication Data

US 2015/0258953 A1 Sep. 17, 2015

(51) Int. Cl.
| | | |
|---|---|---|
| *B60R 21/013* | (2006.01) | |
| *G01D 11/24* | (2006.01) | |
| *G01L 19/14* | (2006.01) | |

(Continued)

(52) U.S. Cl.
CPC ............... *B60R 21/01* (2013.01); *B60R 19/483* (2013.01); *B60R 21/013* (2013.01); *F16B 21/071* (2013.01); *G01D 11/245* (2013.01); *G01L 19/0092* (2013.01); *G01L 19/147* (2013.01); *G01P 1/023* (2013.01); *G01P 15/08* (2013.01); *H05K 5/0073* (2013.01);
(Continued)

(58) Field of Classification Search
CPC ................. B60R 21/0136; B60R 2021/01006; B60R 21/01; B60R 21/013; B60R 19/483; B60Q 1/525; B60Q 9/008; G01L 19/14; G01L 19/147; G01L 19/0092; G01P 1/02; G01P 1/023; G01P 15/08; G01D 11/245; H05K 5/0073; H05K 5/0204; H05K 5/0078; F16B 21/071

USPC ................. 73/493, 431, 756; 280/728.2, 735; 340/436, 665
See application file for complete search history.

(56) References Cited

U.S. PATENT DOCUMENTS 5,714,409 A * 2/1998 Parsons ........................... 430/51
5,763,787 A * 6/1998 Gravel et al. ................... 73/756
(Continued)

FOREIGN PATENT DOCUMENTS

| DE | 197 37 821 | 5/1998 |
|---|---|---|
| DE | 102004050674 | 4/2006 |

(Continued)

OTHER PUBLICATIONS

EP 15 15 8628 European Search Report and Written Opinion, completed Jul. 6, 2015.

(Continued)

*Primary Examiner* — Laura Freedman
(74) *Attorney, Agent, or Firm* — Tarolli, Sundheim, Covell & Tummino LLP (57) ABSTRACT

A circuit mounting assembly includes a housing and a protrusion extending from the housing. At least one retaining member is attached to the protrusion and adapted to deform when received in an opening of a mounting structure and form an interference fit with the mounting structure so as to hold the housing to the mounting structure. At least one attachment member provides a secure attachment of the housing to the mounting structure. Electrical circuitry is located within the housing for performing a function, and an electrical connector for providing an electrical connection between the electrical circuitry located within the housing and an external device.

8 Claims, 8 Drawing Sheets

(51) Int. Cl.
*G01P 1/02* (2006.01)
*B60R 21/01* (2006.01)
*B60R 19/48* (2006.01)
*F16B 21/07* (2006.01)
*H05K 5/00* (2006.01)
*H05K 5/02* (2006.01)
*G01L 19/00* (2006.01)
*G01P 15/08* (2006.01)
*B60R 21/0136* (2006.01)

(52) U.S. Cl.
CPC .......... *H05K 5/0078* (2013.01); *H05K 5/0204* (2013.01); *B60R 21/0136* (2013.01); *B60R 2021/01006* (2013.01)

(56) References Cited

U.S. PATENT DOCUMENTS

| | | | | |
|---|---|---|---|---|
| 5,773,720 | A * | 6/1998 | Miyata | 73/493 |
| 5,804,783 | A * | 9/1998 | Breed | 200/61.45 R |
| 5,828,290 | A * | 10/1998 | Buss et al. | 338/162 |
| 5,873,597 | A * | 2/1999 | Sim | 280/735 |
| 5,945,606 | A | 8/1999 | Tokunaga et al. | |
| 5,950,973 | A * | 9/1999 | Verma | 248/222.51 |
| 6,298,730 | B1 * | 10/2001 | Yamagishi et al. | 73/723 |
| 6,377,445 | B1 * | 4/2002 | Davis et al. | 361/752 |
| 6,435,017 | B1 * | 8/2002 | Nowicki et al. | 73/114.68 |
| 6,736,355 | B2 * | 5/2004 | Palfenier et al. | 248/70 |
| 6,948,375 | B2 * | 9/2005 | Nomura | 73/756 |
| 7,042,212 | B2 * | 5/2006 | Yoshikawa et al. | 324/207.25 |
| 7,116,215 | B2 | 10/2006 | Oonishi | |
| 7,137,472 | B2 * | 11/2006 | Aoki | 180/274 |
| 7,208,943 | B2 * | 4/2007 | Godoy et al. | 324/207.25 |
| 7,277,022 | B2 * | 10/2007 | Christoph et al. | 340/693.5 |
| 7,502,677 | B2 * | 3/2009 | Weichenberger et al. | 701/45 |
| 7,526,963 | B2 * | 5/2009 | Wanami et al. | 73/753 |
| 7,806,222 | B2 * | 10/2010 | Takahashi et al. | 180/274 |
| 7,845,677 | B2 * | 12/2010 | Franke | 280/735 |
| 7,911,331 | B2 * | 3/2011 | Tanabe | 340/436 |
| 8,074,523 | B2 * | 12/2011 | Henzler et al. | 73/756 |
| 8,142,073 | B2 * | 3/2012 | Clark | 374/208 |
| 8,210,037 | B2 * | 7/2012 | Christoph et al. | 73/431 |
| 8,387,457 | B2 * | 3/2013 | Snider et al. | 73/431 |
| 8,396,631 | B2 * | 3/2013 | Buyukbas et al. | 701/49 |
| 8,468,895 | B2 * | 6/2013 | Colombo et al. | 73/756 |
| 8,505,386 | B2 * | 8/2013 | Colombo et al. | 73/756 |
| 8,581,116 | B2 * | 11/2013 | Ludwig | 174/480 |
| 8,619,429 | B2 * | 12/2013 | Moser et al. | 361/757 |
| 8,621,925 | B2 | 1/2014 | Dietrich et al. | |
| 8,763,970 | B2 * | 7/2014 | Mordau et al. | 248/300 |
| 8,966,975 | B2 * | 3/2015 | Campbell et al. | 73/493 |
| 9,003,891 | B2 * | 4/2015 | Frank | 73/756 |
| 2002/0069700 | A1 | 6/2002 | DIrmeyer et al. | |
| 2004/0211875 | A1 * | 10/2004 | Wisniewski et al. | 248/500 |
| 2007/0267941 | A1 * | 11/2007 | Eidel et al. | 310/311 |
| 2008/0030973 | A1 | 2/2008 | Mascha | |
| 2009/0198418 | A1 * | 8/2009 | Itoga | 701/46 |
| 2009/0300893 | A1 * | 12/2009 | Herrmann et al. | 24/595.1 |
| 2010/0308192 | A1 * | 12/2010 | Spratte et al. | 248/224.8 |
| 2011/0107835 | A1 | 5/2011 | Campbell et al. | |
| 2012/0237402 | A1 * | 9/2012 | Cantarelli et al. | 422/111 |
| 2012/0247179 | A1 * | 10/2012 | Kerin et al. | 73/23.2 |
| 2013/0333941 | A1 * | 12/2013 | Snider | 174/535 |
| 2014/0047913 | A1 * | 2/2014 | Waite et al. | 73/117.01 |
| 2014/0137656 | A1 * | 5/2014 | Henzler et al. | 73/756 |

FOREIGN PATENT DOCUMENTS

| | | |
|---|---|---|
| WO | 2011045173 | 4/2011 |
| WO | 2012039950 | 3/2012 |

OTHER PUBLICATIONS

U.S. Appl. No. 14/473,044, filed Aug. 29, 2014.

* cited by examiner

APPARATUS FOR SNAP MOUNTING A CRASH SENSOR

FIELD OF THE INVENTION

The present invention is directed to vehicle crash sensors and is more particularly direct to an apparatus for snap fit mounting a crash sensor to a mounting member of a vehicle.

BACKGROUND OF THE INVENTION

Actuatable vehicle occupant protection systems are known in the art. Such protection systems may include one or more vehicle crash sensors for detecting the occurrence of a vehicle crash condition. When a vehicle crash condition is detected, the protection system may actuate an inflatable device, such as an air bag, for helping to protect an occupant of the vehicle.

Certain types of vehicle crash sensors may include mechanical devices, such as switches, that close in response to deformation of the vehicle or a sudden deceleration of the vehicle. The closure of the mechanical device indicates the occurrence of a vehicle crash condition. Other vehicle crash sensors may include electrical devices, such as an accelerometer, for detection of a crash condition. When a processed output of the electrical device, for example, crosses a threshold level, a vehicle crash condition is determined to be occurring and the actuatable restraining device is actuated.

Vehicle crash sensors for detecting a side impact to a vehicle must have particularly rapid response times as the time period for actuating an inflatable device for occupant protection during a side impact event is significantly less than the time period needed for actuating an inflatable device for occupant protection during a frontal impact event. To help improve the response time of a vehicle crash sensor for sensing side impacts, it is common to locate the vehicle crash sensor at the side location of the vehicle, such as within a door panel of the vehicle. Such side impact crash sensor arrangements may include accelerometers and/or pressure sensors that respectively monitor for changes in the vehicle's sideways acceleration and changes in pressure within a vehicle door as would occur upon crushing of the vehicle door. The vehicle side crash event is determined in response to the side acceleration and pressure change signals.

SUMMARY OF THE INVENTION

In accordance with one embodiment of the present invention, a snap fit circuit mounting assembly includes a housing and a protrusion extending from the housing. At least one retaining member is attached to the protrusion and adapted to deform when received in an opening of a mounting structure and form an interference fit with the mounting structure so as to hold the housing to the mounting structure. At least one attachment member is provided to secure the housing to the mounting structure. Electrical circuitry is located within the housing for performing a function, and an electrical connector for providing an electrical connection between the electrical circuitry located within the housing and an external device.

In accordance with another embodiment of the present invention, a vehicle crash sensor assembly comprises a housing and a protrusion extending from the housing. At least one retaining member is attached to the protrusion and is adapted to deform when received in an opening of a vehicle mounting structure and form an interference fit with the vehicle mounting structure so as to hold the housing to the vehicle mounting structure. At least one attachment member provides a secure attachment of the housing to the vehicle mounting structure. At least one vehicle crash sensor is located within the housing for sensing a vehicle crash condition. An electrical connector for providing an electrical connection between the at least one vehicle crash sensor located within the housing and an external control device.

BRIEF DESCRIPTION OF THE DRAWINGS

The foregoing and other features and advantages of the present invention will become apparent to those skilled in the art to which the present invention relates upon reading the following description with reference to the accompanying drawings, in which.

DETAILED DESCRIPTION

Figure 1:
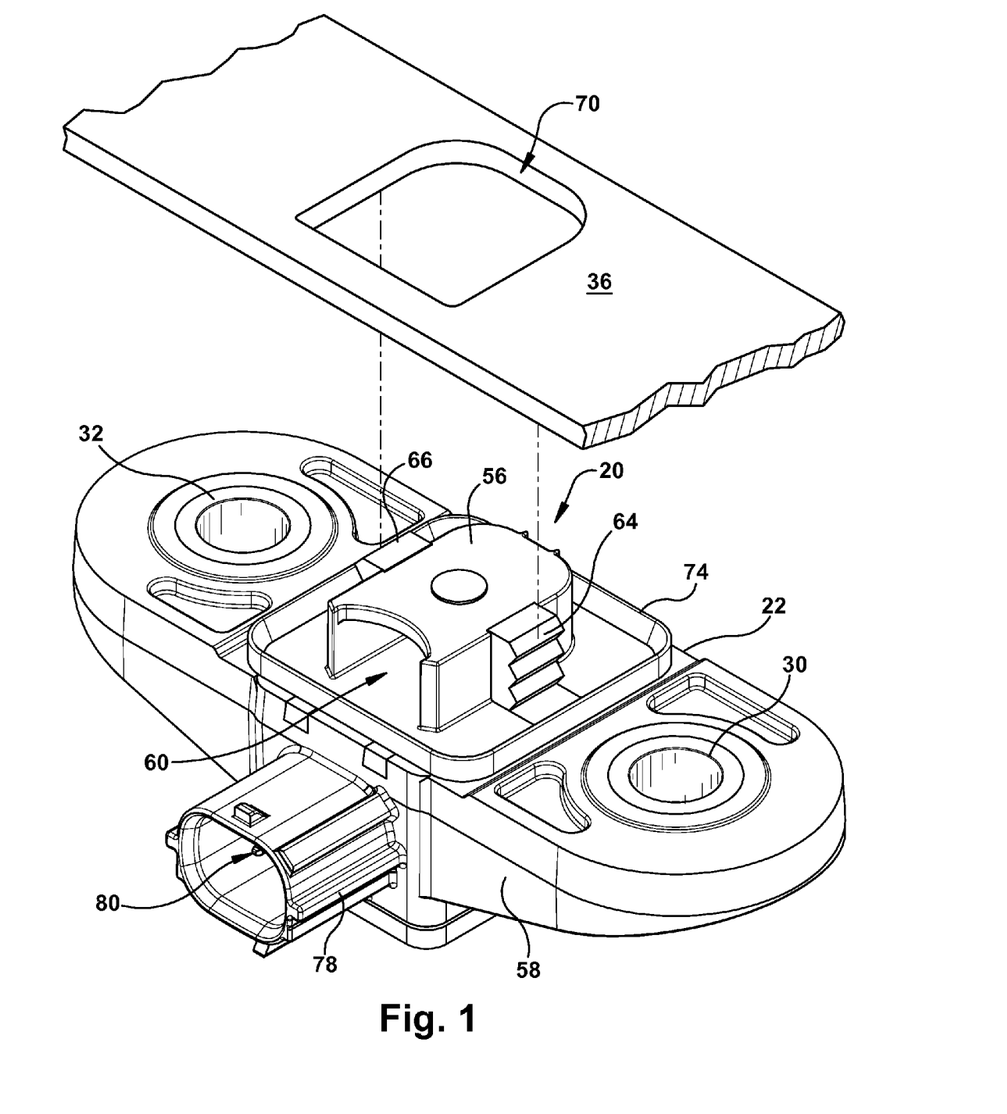
FIG. 1 is a schematic perspective view of a crash sensor mounting assembly made in accordance with one example embodiment of the present invention.
Figure 2:
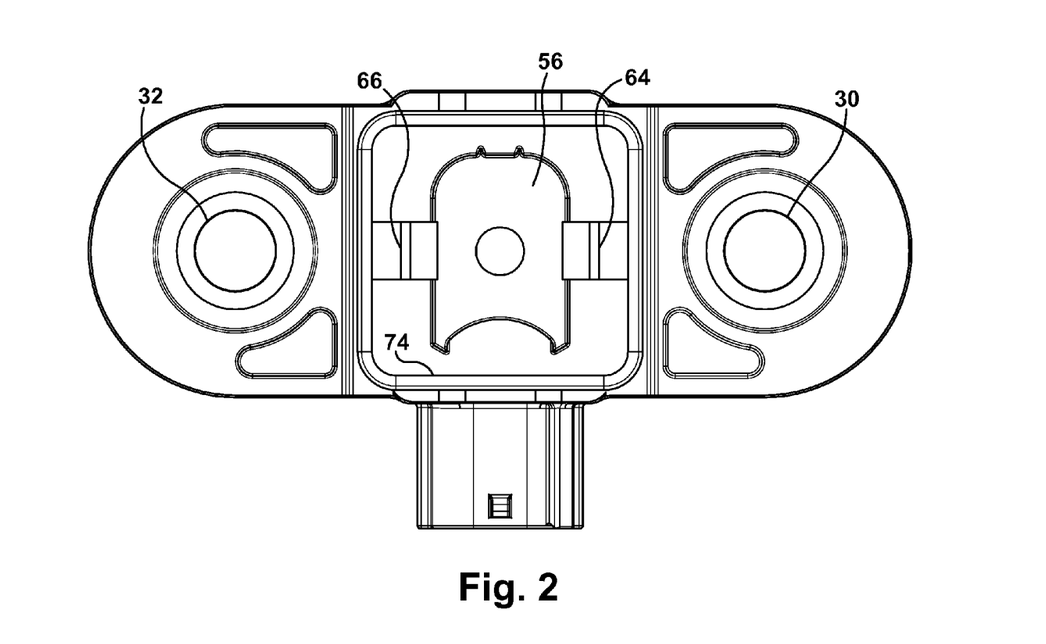
FIG. 2 is a plan view of the crash sensor mounting assembly of FIG. 1.
Figure 3:
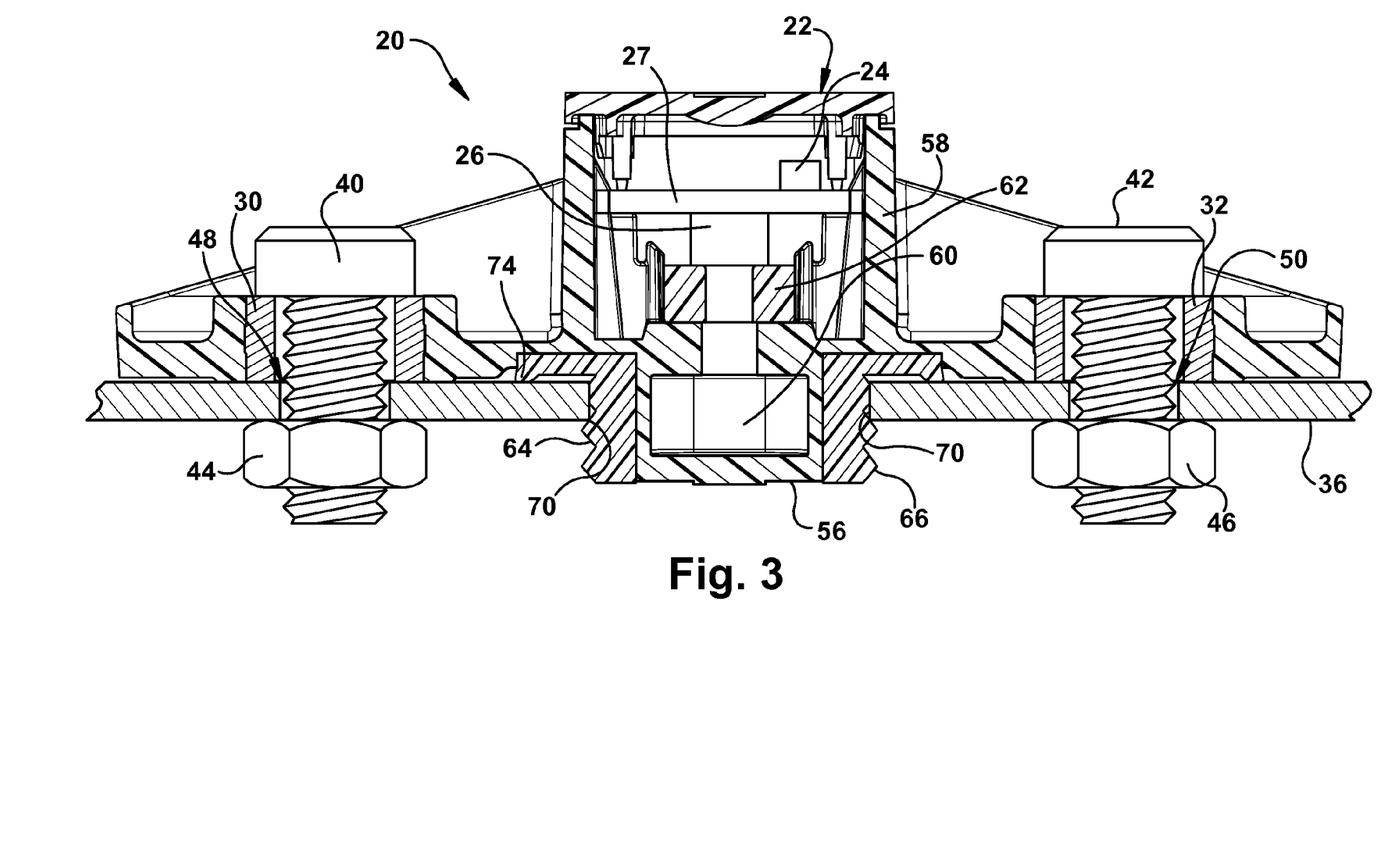
FIG. 3 is side cross sectional view of the crash sensor mounting assembly shown in FIG. 1 schematically showing the crash sensor mounting assembly of FIG. 1 attached to a vehicle mounting structure.
Figure 4:
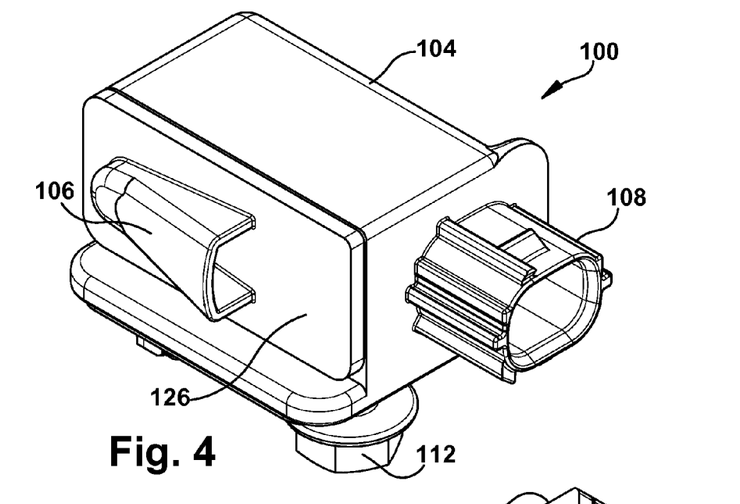
FIG. 4 is a schematic perspective view of a crash sensor mounting assembly made in accordance with another example embodiment of the present invention.
Figure 5:
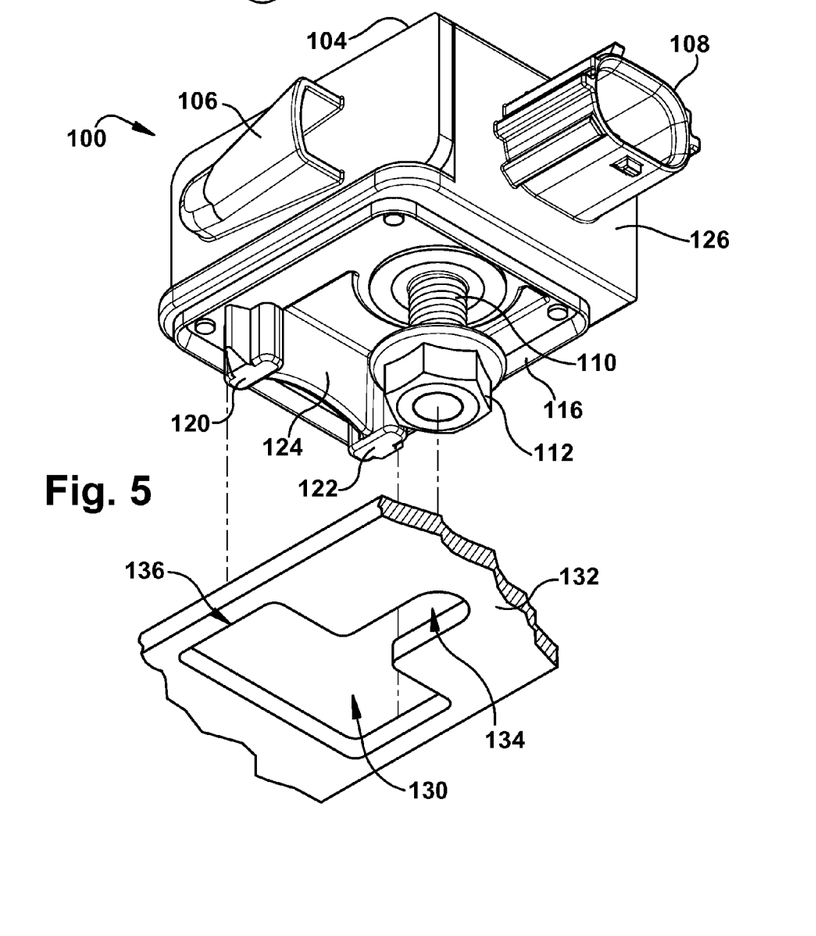
FIG. 5 is a schematic bottom perspective view of a crash sensor mounting assembly of FIG. 4 showing the mounting arrangement with a vehicle structure.
Figure 6:
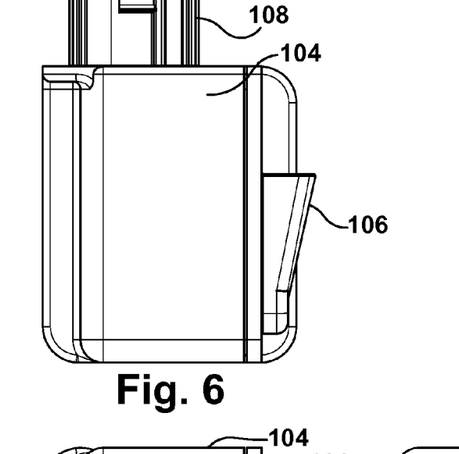
FIG. 6 is a top plan view of the circuit mounting assembly shown in FIG. 4.
Figure 7:
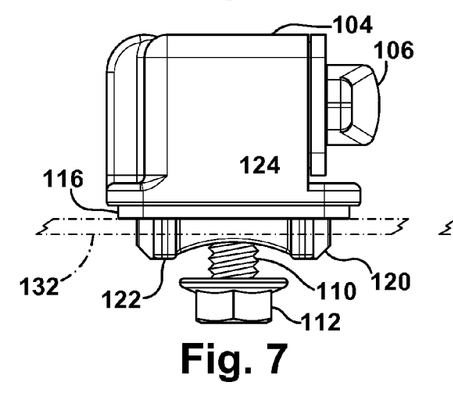
FIGS. 7 and 8 are side elevation views of the circuit mounting assembly shown in FIG. 4.
Figure 8:
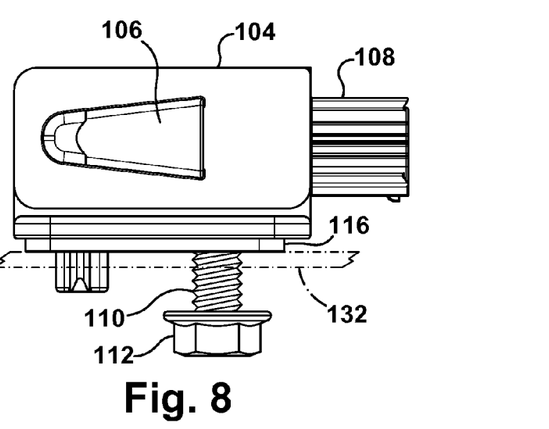
Figure 9:
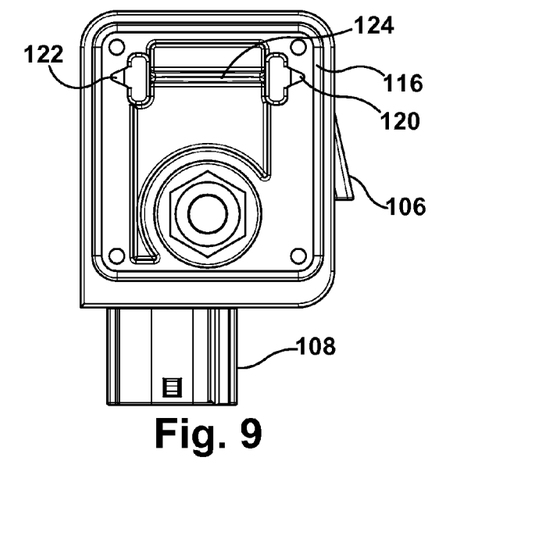
FIG. 9 is a bottom plan view of the circuit mounting assembly shown in FIG. 4.

Referring to FIGS. 1-3, a circuit mounting arrangement in the form of a crash sensor assembly 20, made in accordance with one example embodiment of the present invention, is schematically shown for use as part of an actuatable restraint system in a vehicle. The crash sensor assembly 20 includes a housing 22 that is made from a plastic material in a molding process. Within the housing 22 of the crash sensor assembly 20, in accordance with one example embodiment, is a crash accelerometer 24 and a pressure sensor 26 both mounted to a printed circuit board ("PCB") 27. The accelerometer 24 senses crash acceleration commensurate with a particular axis of orientation. In a crash sensor assembly for detecting a crash event into the side of the vehicle, the accelerometer 22 would have its associated axis of sensitivity oriented perpendicular to the front-to-rear axis of the vehicle. The pressure sensor 26 measures any change in air pressure such as would occur within a vehicle door panel during a side impact crash event of the vehicle. During a crash event, crushing of the vehicle door will result in a decrease interior volume within the door panel which raises the air pressure within the door panel. An electronic control unit (not shown) would be connected to the sensors and make a crash determination based on the sensor outputs.

The housing 22 includes cylindrical mounting bushings 30, 32 for securing the sensor assembly 20 to a mounting member 36, such a door beam, located in a door of a vehicle. Associated bolts 40, 42 would extend through the bores of the cylindrical mounting bushings 30, 32 and into and through associated, aligned mounting holes 48, 50 in the door mounting member 36. Associated nuts 44, 46 are respectively threaded onto the bolts 40, 42 so as to secure the sensor assembly 20 to the mounting member 36 within, for example, the door panel of a vehicle. Alternatively, the nuts 44, 46 could be fixed nuts that are fixed to the mounting member 36 or they could be nuts that are welded to the mounting member 36.

The housing 22 further includes a pressure inlet shroud 56 that extends outward from a main body portion 58 of the housing 22. The pressure inlet shroud 56 includes an opening 60 for allowing air pressure within the door to communicate with the pressure sensor 26 located inside the housing 22 of the sensor assembly 20. This drawing is schematically shown. The pressure sensor forms a closed communication system with the opening in the shroud so as to allow air communication with the pressure sensor and the inlet of the shroud while at the same time preventing any water that could enter the shroud from getting to the PCB 27. An appropriate gasket 62 is used to form a watertight seal against the pressure sensor 26. The gasket 62 keeps any water entering the opening 60 of the shroud 56 from getting to the PCB 27.

The shroud 56 further includes deformable retaining structures 64, 66 secured to the sides of the shroud 56 and arranged so as to be able to snap fit the housing 22 into a commensurate opening in the mounting structure 36 prior to securing the housing to the mounting structure with the bolts 40, 42. In accordance with one example embodiment of the present invention, the retaining structures 64, 66 are made of an elastomeric material such as rubber or plastic and both include a plurality of ribs. The mounting member 36 includes an opening 70 of substantially corresponding shape of the shroud 56 (in this example embodiment, approximately a D-shaped opening) having a slightly larger dimension than the outer dimension of the main part of the shroud 56. During the assembly process for mounting the sensor assembly 20 to the mounting member 36, the shroud 56 is inserted into the opening 70 of the mounting member 36 and pushed. During this process, the retaining structures 64, 66 deform and provide an interference fit between the shroud 56 sensor and the mounting member 36. In effect, the retaining structures 64, 66 allow the sensor assembly 20 to be snap fit into the mounting structure 36 by an assembler using only one hand. The interference fit is sufficient to hold the sensor assembly 20 to the mounting member 36 so that the mounting bolts 40, 42 can be inserted into the mounting bushings 30, 32 and through holes 48, 50 and threaded into the associated nuts 44, 46 and tightened so as to secure the sensor assembly 20 to the mounting member 36 thereby completing a final assembly.

The sensor assembly 20 further includes a sealing gasket 74 located on the shroud side of the housing 22. When the mounting bolts 40, 42 are threaded into the associated nuts 44, 46 and tightened during attachment of the sensor assembly 20 to the mounting member 36, the gasket 74 forms a watertight seal against the mounting member 36. The interior of a vehicle door may be divided into a wet side and a dry side of the door. The wet side of the door is subject to wetness that could occur when the vehicle is subject to rain, etc. The dry side of the vehicle door is sealed in a manner that keeps wetness away from the dry side of the interior of the door. The gasket 74 aids in this wet/dry separation. As mentioned, there is also a watertight seal with the pressure sensor 26 and shroud entrance using the gasket 62 so as to prevent any water entering the pressure shroud opening 60 from getting to the PCB 27.

The housing 22 of the sensor assembly 20 further includes a connector shroud 78 located on the dry side of the sensor assembly 20 including associated electrical connector pins 80 therein forming an electrical connector so as to provide electrical communications between the sensors 24, 26 located with the housing 22 of the sensor assembly 20 and any external control electronics such as an electronic control unit ("ECU") (not shown) of the vehicle restraining system that is used to process the sensor signals and make a crash determination and control an actuatable occupant restraining device.

The gasket 74 and the retaining structures 64, 66 are, in accordance with one example embodiment of the present invention, molded in a single molding step to respectively provide the sealing function and the snap fit retention function for the assembly 20.

Referring to FIGS. 4-9, another example embodiment of the present invention is shown. In accordance with this example embodiment, a sensor assembly 100 includes a housing 104 having a pressure inlet shroud 106 and an electrical connector shroud 108 with associated electrical connection pins located therein so as to form an electrical connector. A threaded mounting stud 110 is attached to and extends from the housing 104. A nut 112 is threadably received on the threaded mounting stud 110. Also extending from the housing 104 is a water seal gasket 116 that provides a similar sealing function as gasket 74 described above.

The housing 104 further includes spaced apart retaining structures 120, 122 attached to a rigid retaining member 124 also extending from a main body portion 126 of the housing 104. The retaining structures 120, 122 are made from an elastomeric material as are the retaining structures 64, 66 described above. Although the retaining structures 120, 122 could each have a plurality of ribs as did the retaining structures 64, 66, in accordance with this example embodiment, the retaining structures 120, 122 have a generally V-shaped in cross section retaining portion. The mounting opening 130 in a mounting member 132, such as a mounting beam located in a vehicle door panel, is shaped and dimensioned so as to tightly receive the retaining structures 120, 122 when the housing 104 is pushed against the mounting member 132. In effect, the retaining structures 120, 122 allow the housing 104 to be snap fit into the mounting structure 132.

The mounting opening 130 further includes a key slot 134 to receive the mounting stud 110. Those skilled in the art will appreciate that during assembly of the sensor assembly 100 to the mounting member 132, the assembly 100 is first angled so as to insert the mounting stud 110 and attached nut 112 into the wide portion 136 of the mounting opening 130. The assembly 100 is then slid relative to the mounting member 132 so as to slide the mounting stud 110 into the key slot 134. The assembly 100 is then further pushed toward the mounting member 132 so as to snap fit the retaining structures 120, 122 into an interference fit with the sides of the wide portion 136 of the mounting opening 130. The mounting structures 120, 122 sufficiently hold the assembly 100 to the mounting member 132 so as to allow an assembler to tighten the nut 112 so as to secure the housing 104 to the mounting member 132. With this particular design, it should be appreciated that the pressure inlet shroud 106 and the electrical connector shroud 108 are both located on the dry-side of the vehicle door with the nut 112 is on the wet-side of the door.

Figure 10:
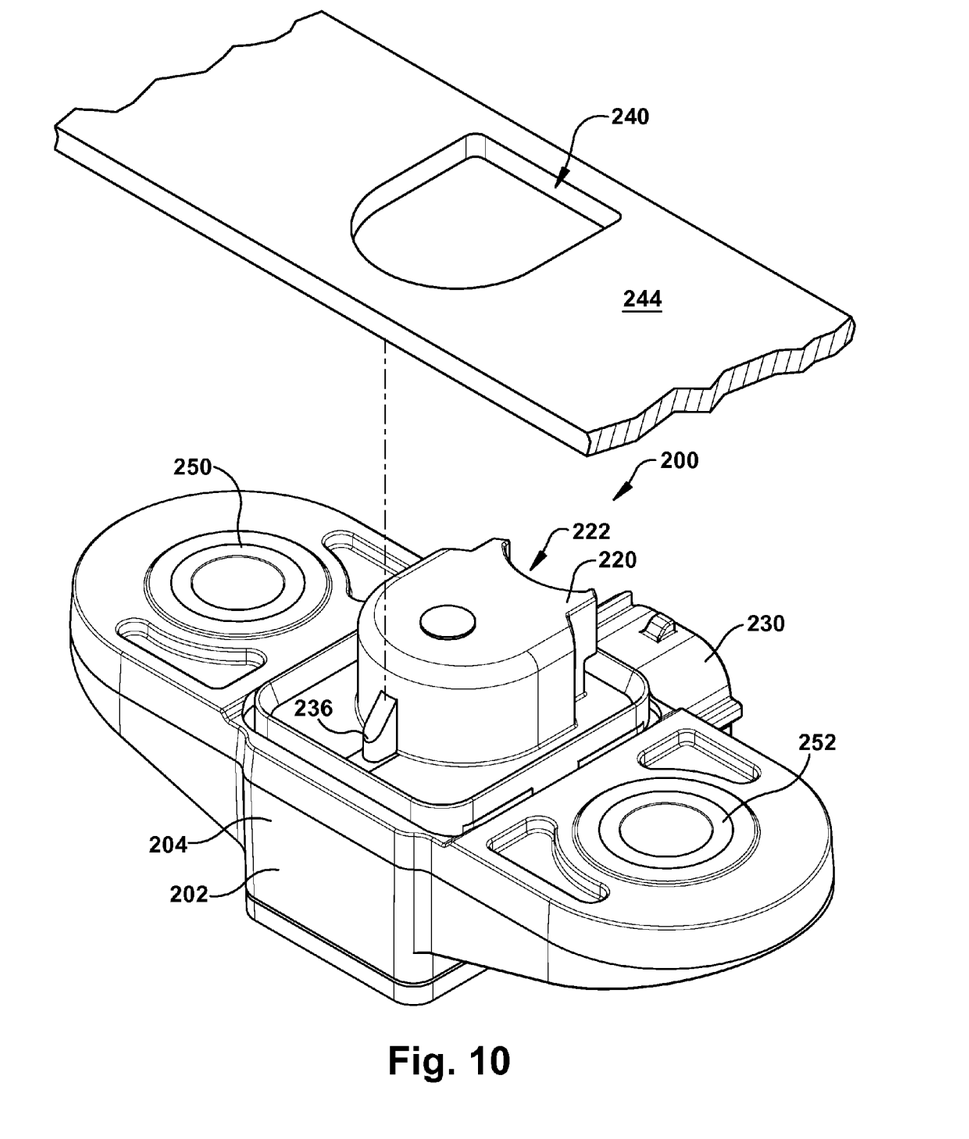
FIG. 10 is a schematic perspective view of a crash sensor mounting assembly made in accordance with yet another example embodiment of the present invention showing the mounting arrangement with a vehicle structure.
Figure 11:
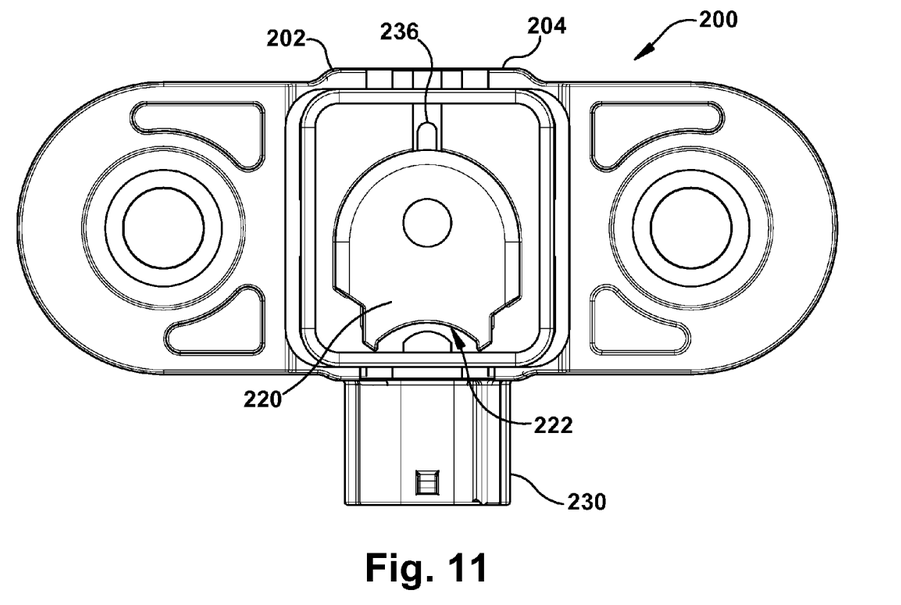
FIG. 11 is a top plan view of the crash sensor mounting assembly of FIG. 10.
Figure 12:
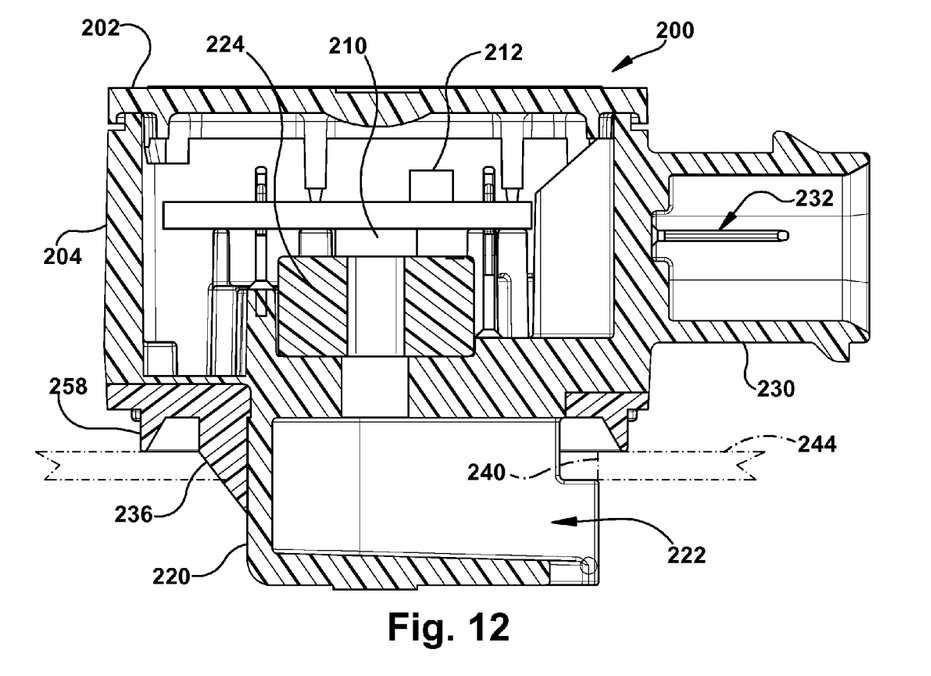
FIG. 12 is side cross sectional view of the crash sensor mounting assembly shown in FIG. 10 schematically showing the crash sensor mounting assembly attached to a vehicle mounting structure.

Referring to FIGS. 10-12, yet another example embodiment of the present invention is shown. In accordance with this example embodiment, a sensor assembly 200 includes a housing 202 having a main body portion 204. Internal to the housing 202 is a pressure sensor 210 and an accelerometer 212. A pressure shroud 220 extends from the main body portion and having an access port 222 that provides air pressure communications from outside of the sensor assembly 200 to the pressure sensor 210 inside of the housing 202. An electrical connector shroud 230 extends from the main body portion 204 and includes electrical connector pins 232 that provide an electrical connection to the sensors 210, 212 located inside of the housing 202. A gasket 224 provides a watertight seal against the pressure sensor 210 so that any water entering the opening of the shroud 220 would not get to any other internal circuitry or accelerometer 212.

A retaining member 236 is formed on the side of the pressure shroud 220 by, for example, an injection molding process. As described above with regard to the other retaining members in other embodiments, the retaining member 236 is, in accordance with one example embodiment, made from an elastomeric material such as plastic that can deform when inserted into an opening 240 in a mounting member 244. The mounting structure 244 is, for example, a beam structure located within the vehicle door. The opening 240 in the mounting structure 244 is substantially in the same shape as the pressure shroud 220 (generally D-shaped in this example embodiment) and dimensioned slightly larger than the outer dimensions of the pressure shroud 220 so that when the housing is mounted to the mounting structure 244, the retaining member 236 deforms and forms an interference fit with the opening 240 of the mounting member 244. In effect, the assembly 200 is snap fit into the mounting structure 244. Once the housing 204 is snap fit into the opening of the mounting structure 244, it is held in place by the retaining member 236 so that an assembler could insert mounting bolts (not shown) into cylindrical mounting bushings 250, 252 and into receiving bores in the mounting structure 244. The bolts could then be threaded into associated nuts and tightened so as to attach the housing 204 to the mounting member 244 in a similar manner as described above with regard to the other embodiments of the present invention.

The assembly 200 further includes a water seal gasket 258 attached to and extending from the main body portion 204 of the housing 202. The water seal gasket 258 is provided to form a watertight seal between the main body portion 204 of the housing 202 and the mounting member 244. This will maintain the watertight seal between the wet side and dry sides of the vehicle door as described above with regard to the other embodiments of the present invention. As mentioned, the gasket 224 also forms a watertight seal to prevent water from contacting internal circuitry/sensors of the assembly.

From the above description of the invention, those skilled in the art will perceive improvements, changes and modifications. Such improvements, changes and modifications within the skill of the art are intended to be covered by the appended claims.

Having described the invention, the following is claimed:

1. A vehicle crash sensor assembly comprising:
   a housing;
   a pressure sensor located within said housing;
   a pressure access inlet shroud extending from said housing, said pressure access inlet shroud having an internal air flow passage for allowing air pressure external to said housing to flow through said air flow passage and reach said pressure sensor located within said housing;
   at least one retaining member attached to said pressure access inlet shroud and adapted to deform when received in an opening of a vehicle mounting structure and form an interference fit with the vehicle mounting structure so as to hold the housing to the vehicle mounting structure;
   at least one attachment member for providing a secure attachment of said housing to the vehicle mounting structure;
   at least one vehicle crash sensor located within said housing for sensing a vehicle crash condition; and
   an electrical connector for providing an electrical connection between said at least one vehicle crash sensor located within said housing and an external control device.

2. The vehicle crash sensor assembly of claim 1 wherein said at least one retaining member includes a plurality of ribbed elements.

3. The vehicle crash sensor assembly of claim 2 wherein said at least one retaining member is made from an elastomeric material.

4. The vehicle crash sensor assembly of claim 1 wherein said at least one retaining member includes a plurality of V-shaped elements.

5. The vehicle crash sensor assembly of claim 4 wherein said at least one retaining member is made from an elastomeric material.

6. The vehicle crash sensor assembly of claim 1 further including a gasket secured to said housing so as to provide a watertight seal between said housing and the vehicle mounting structure.

7. A vehicle crash sensor assembly comprising:
   a housing;
   a protrusion extending from said housing;
   at least one retaining member attached to said protrusion and adapted to deform when received in an opening of a vehicle mounting structure and form an interference fit with the vehicle mounting structure so as to hold the housing to the vehicle mounting structure;
   at least one attachment member for providing a secure attachment of said housing to the vehicle mounting structure;
   at least one vehicle crash sensor located within said housing for sensing a vehicle crash condition; and
   an electrical connector for providing an electrical connection between said at least one vehicle crash sensor located within said housing and an external control device,
   wherein said at least one crash sensor includes a pressure sensor and wherein said protrusion includes a pressure access shroud for allowing air pressure external to said housing to reach said pressure sensor, said at least one retaining member being attached to said pressure access shroud, and
   wherein said housing includes at least one mounting bore and wherein said attachment member includes a threaded bolt and nut, said bolt extending through said at least one mounting bore and through the vehicle mounting structure and secured with said nut.

8. A vehicle crash sensor mounting arrangement comprising:
   a housing;
   a protrusion extending from said housing;
   a vehicle mounting structure having an opening with a key slot;
   at least one deformable retaining member attached to said protrusion and adapted to deform when received in said opening of said vehicle mounting structure and form an interference fit with the vehicle mounting structure so as to hold the housing to the vehicle mounting structure;

a threaded bolt extending from said housing for providing a secure attachment of said housing to the vehicle mounting structure, said threaded bolt being receivable in said key slot of said vehicle mounting structure;

a nut being threadably received on said threaded bolt for securing said housing to said vehicle mounting structure;

at least one vehicle crash sensor located within said housing for sensing a vehicle crash condition; and an electrical connector for providing an electrical connection between said at least one vehicle crash sensor located within said housing and an external control device.

* * * * *